(12) United States Patent
Rastegar

(10) Patent No.: US 7,821,183 B2
(45) Date of Patent: Oct. 26, 2010

(54) ELECTRICAL GENERATORS FOR LOW-FREQUENCY AND TIME-VARYING ROCKING AND ROTARY MOTION

(75) Inventor: Jahangir S. Rastegar, Stony Brook, NY (US)

(73) Assignee: OmniTek Partners LLC, Bayshore, NY (US)

( * ) Notice: Subject to any disclaimer, the term of this patent is extended or adjusted under 35 U.S.C. 154(b) by 0 days.

(21) Appl. No.: 12/142,739

(22) Filed: Jun. 19, 2008

(65) Prior Publication Data

US 2009/0315431 A1    Dec. 24, 2009

(51) Int. Cl.
*H01L 41/113* (2006.01)
(52) U.S. Cl. ........................................... 310/339
(58) Field of Classification Search .................. 310/339
See application file for complete search history.

(56) References Cited

U.S. PATENT DOCUMENTS

| | | | | |
|---|---|---|---|---|
| 5,814,921 A * | 9/1998 | Carroll | ......................... | 310/339 |
| 7,157,835 B2 * | 1/2007 | Sakai | ......................... | 310/339 |
| 7,345,407 B2 * | 3/2008 | Tanner | ......................... | 310/339 |
| 7,439,657 B2 * | 10/2008 | Clingman et al. | ........... | 310/339 |
| 7,504,764 B2 * | 3/2009 | Chang et al. | ................. | 310/339 |
| 7,511,404 B2 * | 3/2009 | Lee | ............................. | 310/339 |
| 7,579,757 B2 * | 8/2009 | Kulah et al. | .................. | 310/339 |
| 2005/0280334 A1 * | 12/2005 | Ott et al. | ....................... | 310/339 |
| 2008/0277941 A1 * | 11/2008 | Bowles et al. | ................. | 290/54 |

\* cited by examiner

*Primary Examiner*—Thomas M Dougherty

(57) ABSTRACT

A method for generating electrical energy from a first motion having a low and/or variable frequency is provided. The method including: transferring the first motion to a first device; and intermittently transferring the first motion from the first device to a second device operating at a frequency which is higher and/or more constant that the first motion.

11 Claims, 9 Drawing Sheets

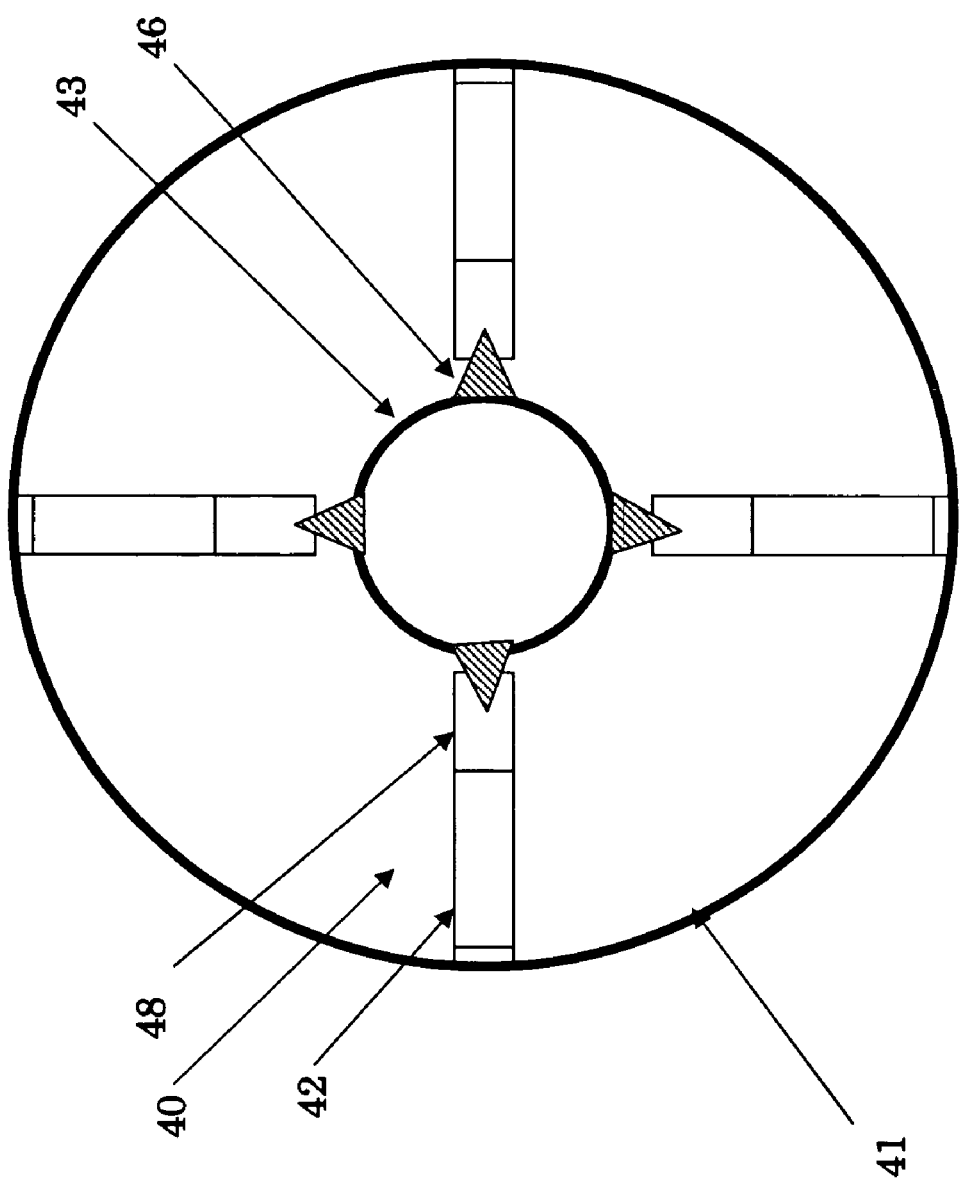

ELECTRICAL GENERATORS FOR LOW-FREQUENCY AND TIME-VARYING ROCKING AND ROTARY MOTION

BACKGROUND OF THE INVENTION

1. Field of the Invention

The present invention relates generally to electrical generators, and more particularly to electrical generators for low-frequency and time-varying rocking and rotary motions.

2. Prior Art

In recent years, particularly following the development of low-power electronics, sensors and wireless communications devices, electrical energy generators that harvest energy from the environment have seen renewed attention. The most common means of generating electrical energy is the use of magnets and coils using rotary type of generators. Generators that harvest energy from vibration that use either coils and magnets or active materials such as piezoelectric materials based devices have also been developed, particularly for low power consuming electronics. In the latter area, piezoelectric materials have been used widely to generate electrical energy from the ambient vibration.

To efficiently generate electrical energy from mechanical energy using active materials such as piezoelectric elements or by using various types of magnets and coils arrangements, the frequency of the input motion must be relatively high and not time varying. This means that if the input motion is rotary, then the rotational velocity must be relatively constant and high, preferably in the order of several thousands. On the other hand, if the motion is oscillatory, such as vibratory or rocking or the like, then the frequency of vibration or rocking must be high, preferably in the order of a few thousands when using magnet and coil type of mechanical to electrical energy conversion devices and even higher frequencies if, for example, piezoelectric based of mechanical to electrical energy conversion devices are employed.

However, in many applications, for example in platforms that rock through relatively small angles such as ships, trains or trucks; the rocking or oscillating frequency is very low and even in the order of 0.2-0.5 Hz and time varying, thereby making the operating of all currently available energy harvesting devices, i.e., mechanical energy to electrical energy conversion devices, extremely inefficient. Similarly, in rotary machinery such as windmills or turbines used to harvest tidal or ocean waves or other similar flows, the input rotary speed is relatively low and varies significantly over time, thereby making the operation of all currently available electrical energy generators highly inefficient. In fact, in most such turbo-machinery, such as windmills, to make the generation cycle efficient, gearing or other similar mechanisms have to be used to increase the output speed and in many applications to also regulate the output speed. Input speed increasing gearing and speed control mechanisms are, however, costly and significantly increase the system complexity and cost, particularly those related to maintenance and service.

SUMMARY OF THE INVENTION

There is therefore a need for a method that can be used to develop electrical energy generators that could efficiently generate electrical energy from slow and time varying rocking (oscillatory) platforms and rotary input motion. To achieve high mechanical energy to electrical energy conversion efficiency, the claimed methods and apparatus can lead to generators that operate at high and relatively constant input motion frequencies.

In particular, there is a need for energy harvesting generators that could efficiently generate electrical energy from the motion of platforms that rock through relatively small angles such as buoys, ships, trains or trucks, in which the rocking frequency could vary significantly over time and even from one cycle of rocking motion (oscillation) to the next, with frequencies that could even be in the order of 0.1-0.5 Hz or even lower.

There is also a particular need for efficient electrical energy generators for rotary machinery, such as windmills and/or turbines, used to harvest tidal or ocean waves or other similar flows and the like in which the input motion varies widely and could even reverse, with input rotational velocities that could be very low, even of the order of 5-10 round per minute (rpm) or even lower. In particular, there is a need for such electrical energy generators to operate without the need for costly speed increasing and regulating devices that significantly increase the equipment cost as well as maintenance and service costs and result in significant amount of down time.

Accordingly, methods are provided for electrical energy generators to harvest electrical energy, i.e., convert mechanical energy to electrical energy, from slow and time varying rocking (oscillatory) platforms and rotary input motion. With this method, the generator device does not require (but can nonetheless use) devices such as speed increasing devices and/or speed regulating devices. In addition, the disclosed methods can provide the means to develop highly efficient mechanical energy to electrical energy conversion devices since the resulting mechanical to electrical energy conversion devices can operate at appropriately high and relatively constant input motion frequencies.

In addition, highly efficient piezoelectric based energy harvesting electrical energy generators are provided that can mount on platforms that oscillate (rock or vibrate) at relatively low to moderate frequencies based on the aforementioned methods. The maximum amount of available mechanical energy during each cycle of platform oscillation (rocking motion) can be proportional to the inertia of the oscillating element; the frequency and amplitude of platform vibration; and the size of the generator.

Furthermore, electrical energy generators are provided for rotary machinery in which the input rotary speed can be relatively low and vary significantly over time such as in wind mills, turbo-machinery used to harvest tidal flows or ocean waves, and the like.

Such generators can be based on piezoelectric elements to convert mechanical energy to electrical energy. However, it is appreciated by those familiar with the art that other energy conversion devices can be used such as other active materials or appropriate coil and magnet type of mechanical to electrical energy conversion devices can be used instead of or in combination with piezoelectric elements.

The present methods can include two-stage devices of operation. The input (rocking or oscillatory or rotary) motion can drive the first stage devices. The first stage device in return can affect repeated vibration of at least one vibrating element that is tuned to vibrate at a fixed prescribed frequency. The mechanical energy stored in the vibrating elements can be then transformed into electrical energy using piezoelectric elements, even though coil and magnet type of electrical energy generating devices could also be used.

The electrical energy generators can be very simple, can efficiently operate over a very large range of input oscillatory frequencies or rotary speeds, and can require minimal service and maintenance.

BRIEF DESCRIPTION OF THE DRAWINGS

These and other features, aspects, and advantages of the apparatus of the present invention will become better understood with regard to the following description, appended claims, and accompanying drawings where:

FIG. 4b illustrates a plan view of the two-stage energy harvesting device of FIG. 4a.

DETAILED DESCRIPTION OF THE PREFERRED EMBODIMENT

Figure 1:
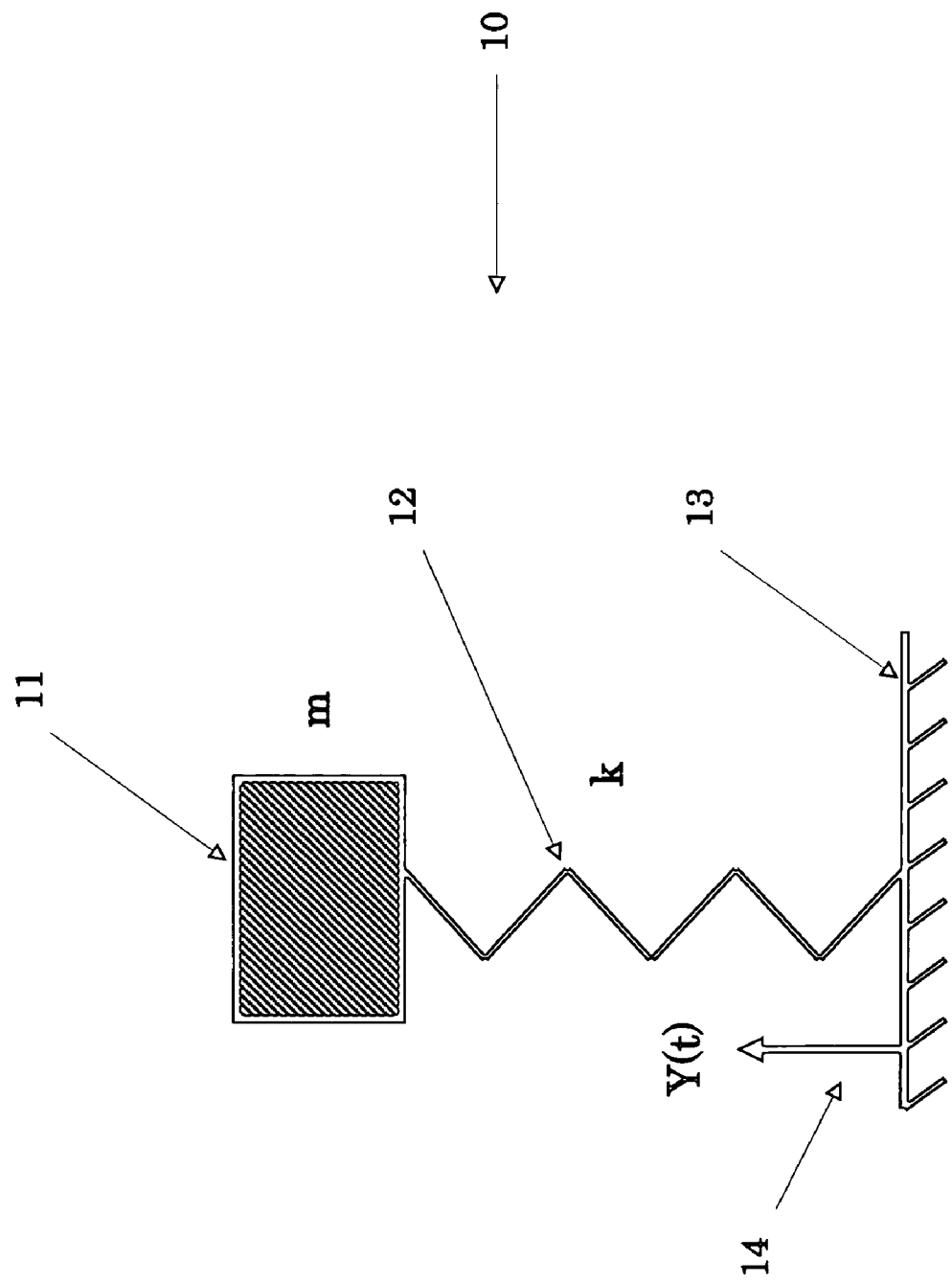
FIG. 1 illustrates a schematic view of a mass-spring system mounted on a vibrating platform that is vibrating in the vertical direction.

For a vibrating platform, first consider the amount of mechanical energy that is made available by the platform for harvesting. Consider the mass-spring system 10, with a mass element m and a spring element k, indicated by numerals 11 and 12, respectively, as shown in FIG. 1. The mass-spring system 10 is mounted on a vibrating platform 13 that is vibrating in the vertical direction indicated by the vector Y(t) and enumerated as 14. Assume that the platform vibrating Y(t) is a simple harmonic motion with a frequency $\omega$ and amplitude A. Thus, if the natural frequency of the mass-spring system is well above that of $\omega$ and damping is negligible, during each cycle of platform motion, the mass m is raised and then lowered a total maximum distance of 2A, i.e., its potential energy is varied by a maximum amount of 2Amg, where g is the gravitational acceleration. Here, it is assumed that the inertia of the vibrating platform is significantly larger than that of the mass-spring system. Thus, 2Amg is the maximum amount of energy that a vibrating platform can transfer to the vibrating mass-spring system, assuming that there are no losses. This is therefore the maximum amount of energy that becomes available during each cycle of platform vibration for harvesting and transferring into electrical energy. In addition, if the frequency of vibration of the platform $\omega$ is indicated in cycles/sec (Hz), the maximum amount of power that could possibly be harvested becomes (2Amg$\omega$). If the amplitude A is in meters, the mass m is in kg, g is in meter/second square, and $\omega$ in Hz, the above power will have the units of Watts.

As expected, the maximum amount of mechanical energy that is available for harvesting is proportional to the amplitude of the platform vibration and the inertia of the energy harvesting power source. Thus, given a vibrating platform, the only parameter that can be varied to increase the available energy for harvesting is the inertia of the mass-spring system of the energy harvesting power source, while using a properly designed spring element 12. However, by increasing the inertia (mass) of the energy harvesting power source, its size is also generally increased. It can therefore be concluded that to minimize the size of energy harvesting power sources for a specified power requirement, the vibrating mass can be constructed with high-density materials, most of the components of the power source system can be mounted onto the vibrating mass to maximize the inertia of the mass-spring system without increasing the overall size of the power source.

Figure 2:
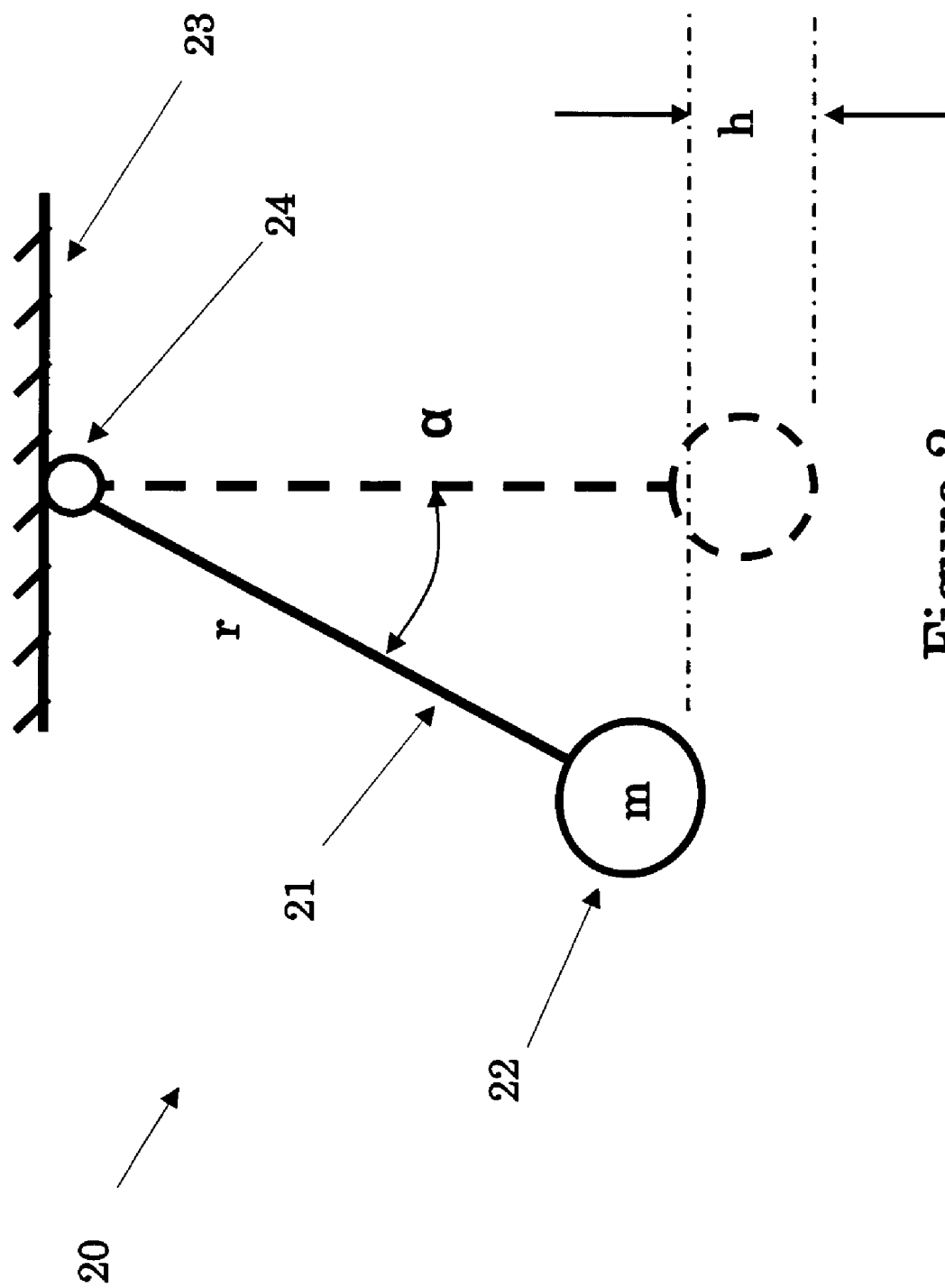
FIG. 2 illustrates a schematic view of a pendulum system mounted on a rotating platform.

If the oscillatory motion of the platform is rotational, such as the rocking motion of a ship, then the simplest method of generating potential energy for harvesting is the use of a pendulum 20, FIG. 2, or some other pendulum-like mechanism. In FIG. 2, a pendulum 20 of length r and carrying a mass m, indicated by numerals 21 and 22, respectively, is shown. The pendulum 20 is attached to the rocking platform 23 at the pin joint 24. If the amplitude of the platform rotational oscillations is $\alpha$, a properly designed pendulum would undergo oscillations of the same amplitude. During each cycle of its oscillations, the pendulum mass m is raised twice a distance h (FIG. 2) above its vertical positioning indicated by dashed lines, thereby giving it a relative potential energy mgh. The distance h=r(1−cos $\alpha$) is proportional to the length r. Therefore, to increase the amount of mechanical energy available for harvesting, the energy harvesting generators have to be constructed as a tall pendulum, which is not considered to be practical. Alternatively, the device could be made wider to accommodate a series of parallel pendulums, or a traveling mass, which is in fact a pendulum with infinite arm length r as described later in this disclosure.

In general, most mechanical to electrical energy conversion devices, including those based on piezoelectric elements and those based on magnets and coils, and their electronics are not efficient when operated at very low frequencies. The efficiency of such systems is also increased if the frequency of vibration is relatively constant. Novel methods are therefore needed for the development of electrical energy generators that could efficiently harvest energy from the present platforms with low and time varying frequency oscillatory or rotary motions.

To this end, a novel method is disclosed that is based on a two-stage energy harvesting strategy to address the aforementioned problems of slow and highly variable input rotary motions and vibrating platforms with low and time varying frequency oscillations. In this novel method, the first stage of the energy harvesting generator consists of the input system with the rotary or oscillatory motion, such as the aforementioned pendulum, hereinafter called the "primary system". Mechanical energy is then transferred intermittently from the "primary system" to one or more "secondary systems" which can be a vibrating system with relatively high and fixed natural frequencies. The mechanical energy is then harvested efficiently from the secondary systems using one or more types of mechanical energy to electrical energy conversion devices such as those based on piezoelectric or other similar active materials or magnet and coil based devices.

Figure 3:
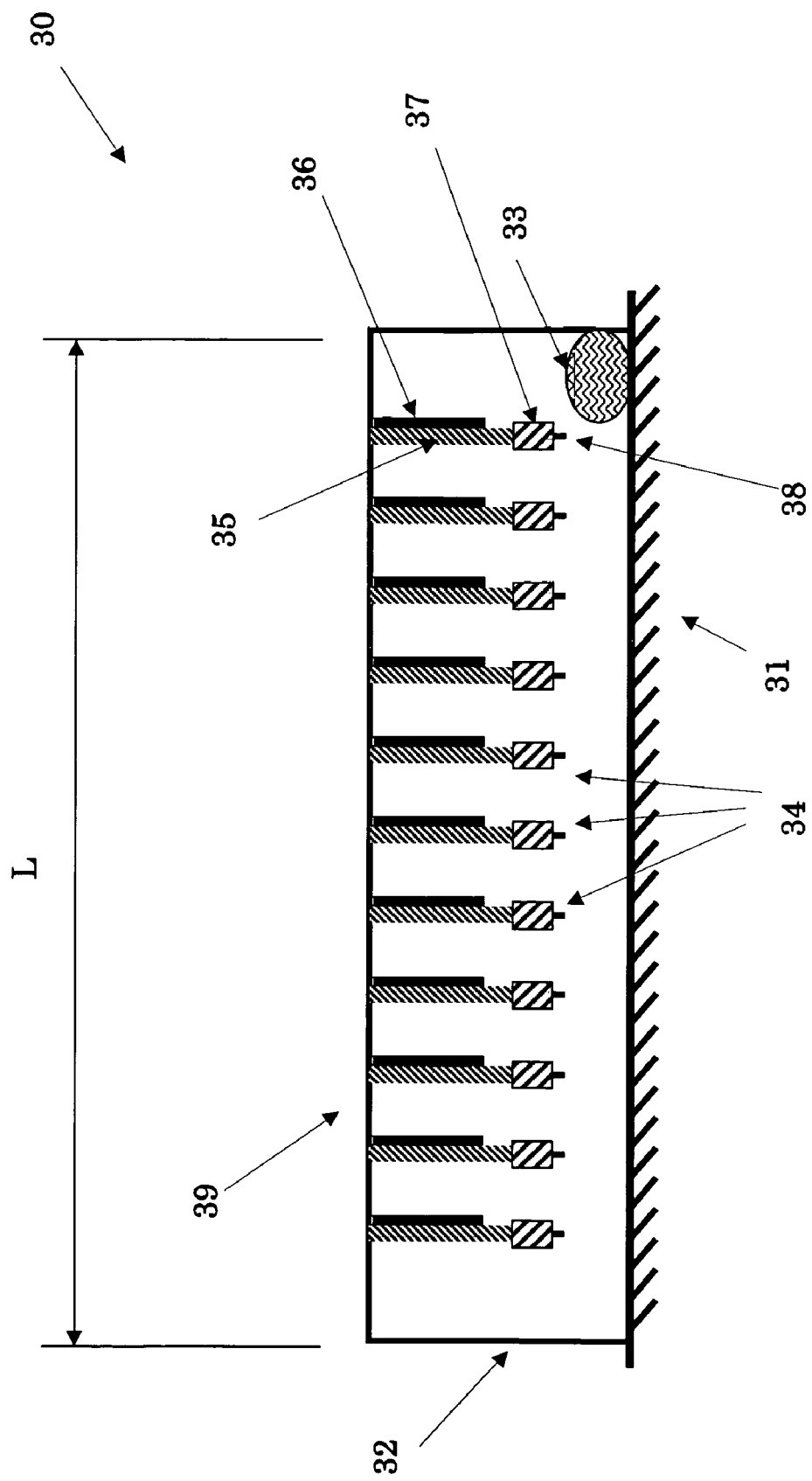
FIG. 3 illustrates a two-stage energy harvesting device for slow and variable input rotary motions with low and time varying frequency oscillations.

The above novel two-stage energy harvesting method for rocking platforms is best described by the following basic embodiment 30, which is shown schematically in FIG. 3. The primary system of the embodiment 30 consists of a simple housing 32, which is attached directly to the rocking platform 31. The rocking oscillation of the platform 31 is considered to be about an axis perpendicular to the plane of the page. As the platform 31 undergoes rotary oscillation, the traveling mass 33 begins to slide from the side that has been raised, travels the length of the housing 32 and ends on its opposite end of the housing. At least one secondary vibratory element 34 is attached to the top portion 39 of the housing 32. Each vibratory element consists of a relatively flexible beam 35, to the tip of which is preferably attached a mass 37 to allow for optimal tuning of the natural frequency of the first mode of vibration of the vibratory elements. The tip of the beam 35 and mass 37 assemblies is preferably provided with a pointed tip 38 for engagement with the traveling mass 33 as described below.

As the traveling mass 33 passes the secondary vibratory elements 34, it engages their free tips 38 and causes the beams 35 to bend slightly in the direction of its travel. Thus, the traveling mass 33 intermittently transfers its motion to the secondary vibratory elements 34 in that it engages the secondary vibratory elements 34 (or element) and at some later time, the traveling mass 33 engages the secondary vibratory elements 34 again. The traveling mass 33 then passes under an engaged secondary vibratory element 34, moving to the next secondary vibratory element 34. The potential energy stored in the released beam element 35 causes it to vibrate. A mechanical to electrical energy conversion means such as a piezoelectric element 36 that is attached to the surface of the beam element can then be used to harvest the available mechanical energy and convert it to electrical energy for collection by an appropriate electronics circuitry (not shown) and direct usage or storage in a storage device such as a capacitor or rechargeable battery (not shown). Such electronics circuits for collecting the charges generated by piezoelectric or other similar elements and storing them in storage devices such as capacitors and/or rechargeable batteries are well known in the art.

All contacting surfaces can be designed to minimize frictional losses. The spacing of the secondary vibratory elements and the total deflection of the beams 35 and their bending stiffness can also be selected to maximize the transfer of potential energy from the traveling mass 33 to the secondary vibratory elements and to ensure that the total potential energy stored in each beam element 35 is harvested by the piezoelectric elements 36 before the next strike of the traveling mass 33. As can be seen, during each cycle of oscillation of the rocking platform 31, each secondary vibratory element is struck twice by the traveling mass 33.

The amount of mechanical energy available can be seen to be proportional to the width L, of the housing 32 of the energy harvesting device 30, and the mass of the traveling mass 33. Such energy harvesting power sources 30 are relatively long but can have fairly low profile. For example, if the traveling mass has a mass of m=0.2 kg, the rocking frequency is ω=0.3 Hz, the width of the energy harvesting power source is L=0.5 m and the rocking amplitude is α=5 deg., the maximum mechanical power that is available for harvesting is $$P_{max} = 2 \, m \, g \, \omega L \sin(\alpha) = 0.051 \, W \text{ or } 51 \, mW$$

where g is the gravitational acceleration.

Figure 3B:
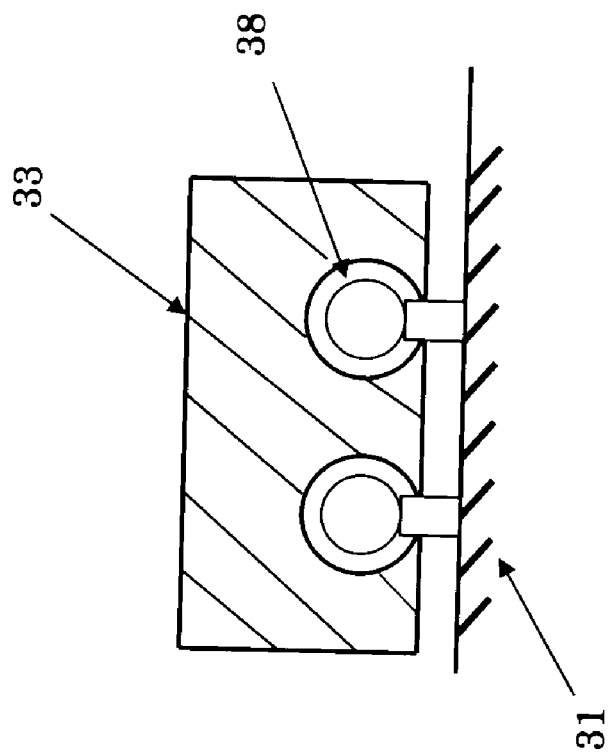
FIGS. 3a and 3b show first and second variations of means by which the mass moves in the two-stage energy harvesting device of FIG. 3.
Figure 3A:
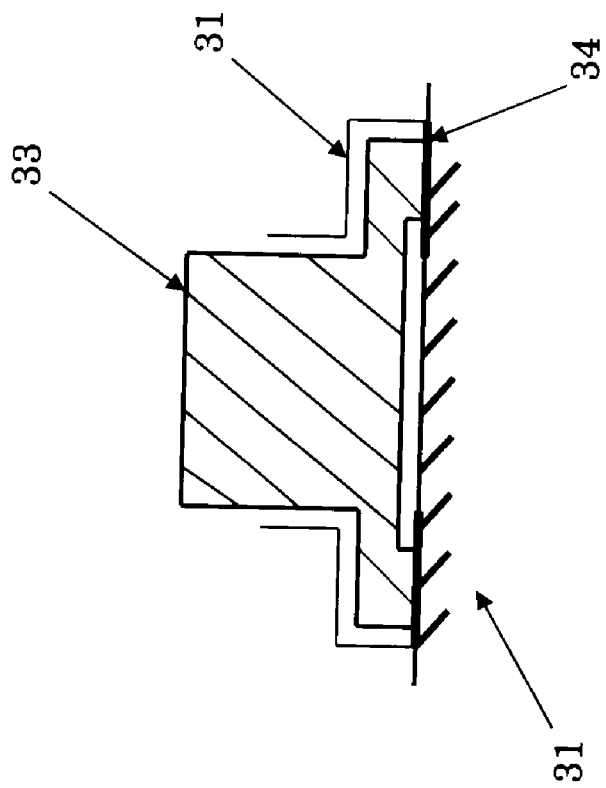

An embodiment shown in FIG. 3 can be developed into numerous different designs with the common characteristic of being designed with two stages, a primary stage that transforms the low and variable frequency and usually small amplitude oscillations (or slow and variable input rotation) into potential energy that becomes available to a secondary stages of vibrating elements with significantly higher and fixed frequency of vibration appropriate for efficient energy harvesting utilizing various means such as piezoelectric elements. In the embodiment of FIG. 3, the two-stage energy harvesting power source design was described with an example of its application to platforms that undergo rocking (rotary) oscillations. The oscillation may, however, be translational or be in the form of the combination of the two. The traveling mass 33 can move along the length L in many ways, such as rolling or translating and may be free to do so or guided on a track 31 as shown in FIG. 3a or rails 38 as shown in FIG. 3b. Low friction materials 34 can be used where the mass 33 contacts the track 31.

It is noted that one major source of loss in devices such as the embodiment of FIG. 3 is the mechanical interface where the traveling mass 33 (i.e., the exciter element) contacts the secondary vibratory elements 34, i.e., the tip elements 38. To eliminate these contact losses, non-contacting magnet elements can be employed, preferably on both traveling mass 33 surface and on the tips 38 of the secondary vibratory elements 34. The two magnets are preferably of opposite poles and as the traveling mass 33 passes under the tip 38 of a secondary vibratory element 34, the two magnets are attracted to each other and as the traveling mass 33 has moved a far enough distance, the secondary vibratory element 24 is released and begin to vibrate, primarily at the frequency of its first mode of vibration. Such an arrangement would allow for a strong interaction between exciters and secondary elements owing to the close proximity of opposite poles. Arrangements using such magnetic means of exciting the secondary vibratory elements are discussed below with regard to further embodiments.

In another embodiment, two-stage energy generators are provided for harvesting mechanical energy and converting it to electrical energy for platforms with low-frequency translational oscillations. Consider the mass-spring system 10 shown in FIG. 1. The platform 13 undergoes a vertical displacement Y(t) in the direction of the arrow 14. The displacement Y(t) causes the mass-spring system 10 to vibrate. The mechanical energy transferred to the mass-spring system is obviously the largest if the motion is a simple harmonic with a frequency that is equal or close to the natural frequency of the mass-spring system 10.

Figure 4:
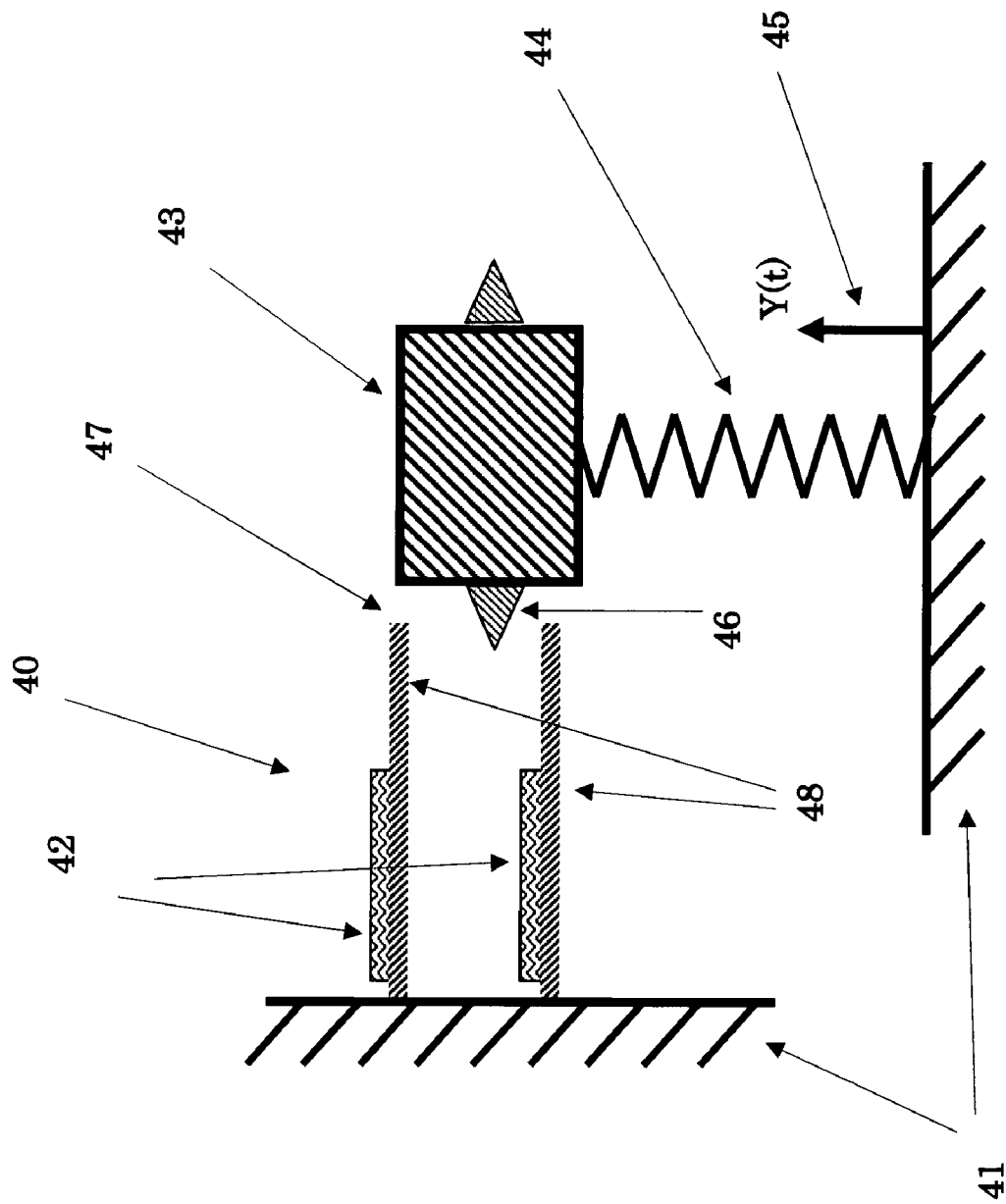
FIG. 4 illustrates two-stage energy harvesting device for slow and variable input vibrating platforms with low and time varying frequency oscillations.

If the amplitude of oscillations of the vibrating platform 13 is relatively large, enough mechanical energy could transfer to the mass-spring system 10 during each cycle of platform 13 motion. This mechanical energy can then be transformed into electrical energy, e.g., by attaching the spring element via a piezoelectric stack to either the moving platform 13 or the mass element 11. However, if the frequency of vibration of the base platform 13 is low, it is difficult to efficiently transfer the aforementioned mechanical energy into electrical energy. For such applications, the present two-stage method provides the means to transfer the mechanical energy from the mass-spring system 10 shown in FIG. 1, i.e., the primary stage, to the secondary vibratory systems 40 with appropriately high natural frequencies as shown in FIG. 4, the operation of which is described below. As a result, the mechanical energy transferred to the primary system is available for transformation into electrical energy at a significantly higher efficiency.

The embodiment of FIG. 4 operates as follows. The mass-spring element (mass 43 and spring 44), i.e., the primary stage, is attached to the base platform 41, which is oscillating vertically in the direction of the arrow 45. The vertical oscillation of the platform 41 is given by the function Y(t). At least one secondary vibratory system 40 is attached to the platform 41 or any other adjacent structure. In the schematic of FIG. 4, the secondary vibratory systems 40 are constructed as beam elements 48, to the surface of each of which a mechanical to electrical energy conversion devices 42 (preferably bimorph piezoelectric elements operating in tension and compression layers as the beam 48 vibrates) are attached. As the base platform 41 oscillates in the direction of the arrow 45, if the natural frequency of the mass 43 and spring 44 system is appropriately selected, i.e., if it is close to the frequency of oscillation of the base platform 41, then a significant amount of available energy is transferred to the mass 43 and spring 44 system. With continued base platform oscillation, the amplitude of oscillation of the mass 43 and spring 44 system increases, until the tip of the protruding element 46 reaches the tip 47 of the beam elements 48 and excite its natural mode of vibration. As a result, part of the mechanical energy of the mass 43 and spring 44 system is transferred to the secondary vibratory systems 40. Thus, the vibrating mass 43 intermittently transfers its motion to the secondary vibratory elements 40 in that it engages the secondary vibratory elements 40 (or element) and at some later time, the vibrating mass 43 engages the secondary vibratory elements 40 again. The elements 42 are then used to transform the mechanical energy of the systems 40 to electrical energy. An appropriate electronics circuitry (not shown) can then harvest the generated electrical energy and direct it for use by certain load or for storage in appropriate electrical energy storage devices such as capacitors and/or rechargeable batteries. The above methods and devices for harvesting the electrical and regulating it for direct use or for storage in capacitors and rechargeable batteries are well known in the art.

It is noted that during each cycle of primary stage oscillation, the entire available mechanical energy does not have to be transferred to the secondary vibratory systems since the transferred mechanical energy could accumulate in the primary stage and be transferred to the secondary vibratory systems in the consequent cycles of primary stage oscillation.

It is noted that the design presented in the schematics of FIG. 4 is merely for the sake of illustrating the method of operation of the embodiment. In practice, however, such two-stage energy harvesting power sources may be designed in a variety of different types. For example, contact between the tips 46 and 47 would result in rapid wear and inefficiency in the transfer of the mechanical energy from the primary stage to the secondary vibratory elements. To make the operation of such a system significantly more efficient, opposing pole magnets can be used instead of physically contacting tips 46 and 47, as was described previously.

Figure 4A:
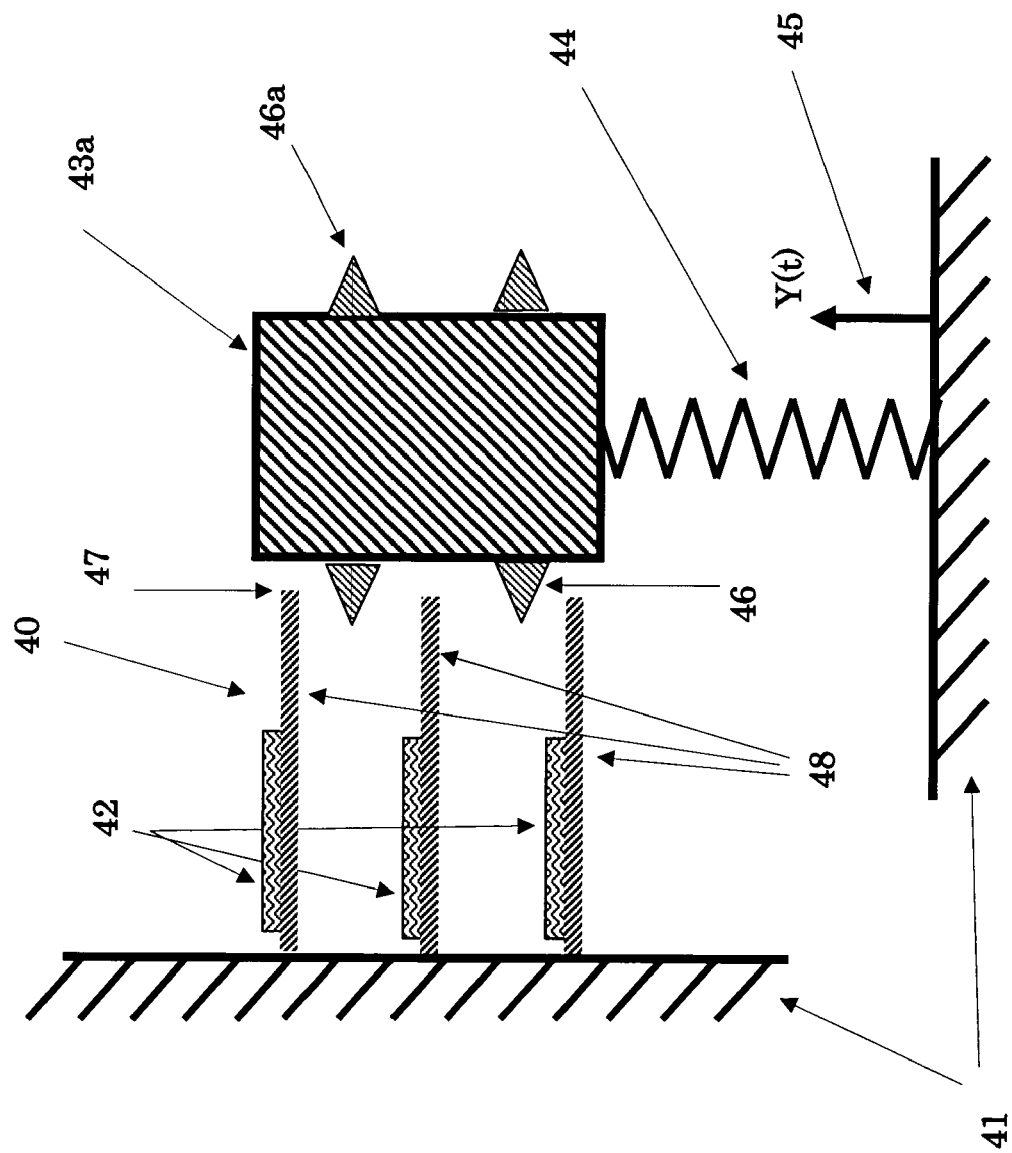
FIG. 4a illustrates a first variation of the two-stage energy harvesting device of FIG. 4.
Figure 4C:
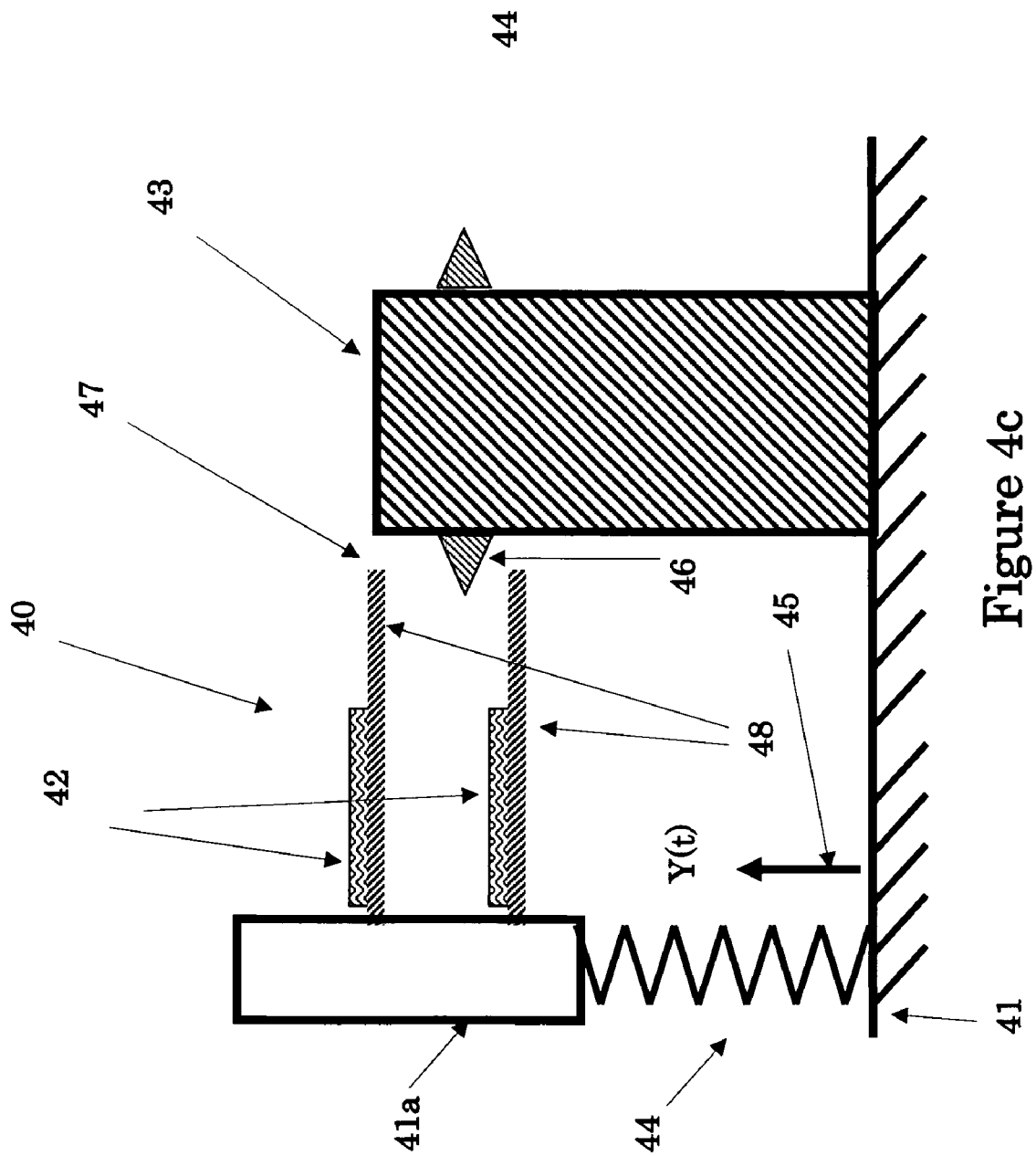
FIG. 4c illustrates a second variation of the two-stage energy harvesting device of FIG. 4.

Although the mass 43 and tip 46 shown in FIG. 4 is associated with one set of secondary vibratory systems 40, such secondary vibratory systems 40 can also be used on the right side of the Figure to engage tip 46 on the right side of mass 43. Furthermore, the tips 46 can be placed around a circumference of the mass and each have secondary vibratory systems 40 associated therewith. Still further, the mass 43 can be elongated in the direction of arrow Y(t) and have more than one row of tips 46, each row of tips 46 engaging secondary vibratory systems 40, as shown in FIG. 4*a* where like features are referred to with like reference numerals. The mass in FIG. 4*a* being referred to with reference numeral 43*a* and having two rows of tips 46 and the right side secondary vibratory systems 40 are not shown for clarity. Furthermore, each tip 43 can engage a top and bottom secondary vibratory system 40 as shown in FIG. 4 or, as shown in FIG. 4*a*, the center secondary vibratory system can be common to the lower 46 and upper tips 46*a*. FIG. 4*b* illustrates a top view (with the topmost secondary vibratory systems 40 removed for clarity). Although described above with regard to the mass 43 being vibrated, as shown in FIG. 4*c*, the structure 41*a* supporting the secondary vibratory systems 40 can vibrate while the mass 43 is fixed to the structure 41 (or both mass and secondary vibratory systems 40 can be free to vibrate).

In yet another embodiment, two-stage generators are provided for generating electrical energy by harvesting mechanical energy from rotary machinery such as windmills or turbines used to harvest tidal or ocean waves or other similar flows, in which the input rotary speed is relatively low and varies significantly over time and may even reverse itself, thereby making the use of all currently available electrical energy generators highly inefficient.

Figure 5:
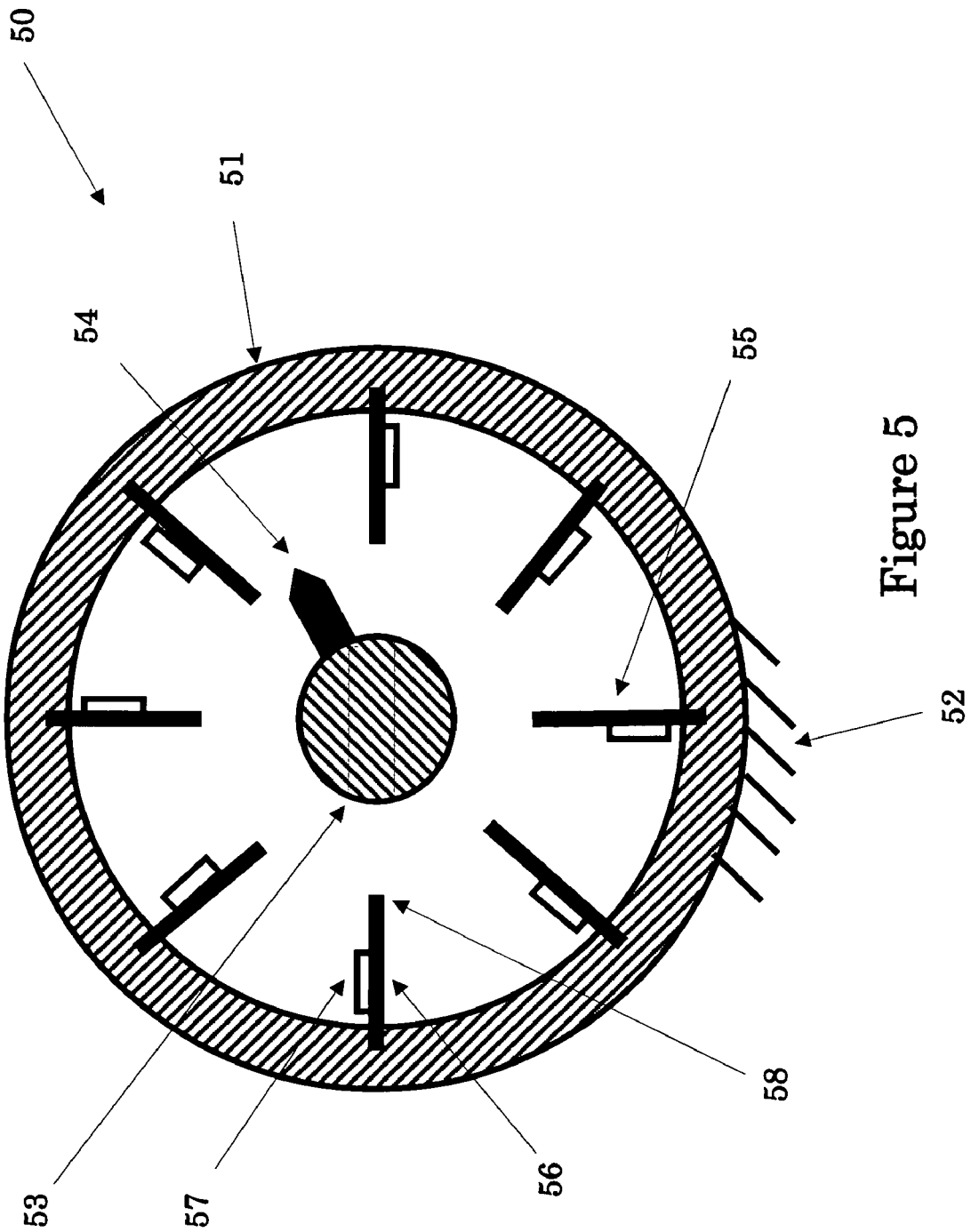
FIG. 5 illustrates a two-stage generator for harvesting energy from slow and varying rotary motion.

The schematic of a basic embodiment 50 of such a two-stage generator design for harvesting energy from slow and varying rotary motion is shown in FIG. 5. The generator consists of an outer housing 51, which is fixed, for example to a fixed structure 52. Internal to the housing is mounted at least one and preferably more secondary vibrating elements 55. In the schematic of FIG. 5, the secondary vibrating elements 55 are constructed as vibrating beam elements 56, over the surface of which certain active materials based mechanical to electrical energy transforming elements 57, such as bimorph piezoelectric elements, are mounted. The input is the rotating or oscillating (both of which are referred to herein as rotating) shaft 53, to which at least one exciter tooth 54 is mounted. The shaft 53 is shown without bearing and support elements known in the art for the sake of clarity. The generator can operate as follows.

As the input shaft 53 rotates or oscillates rotationally, the exciter teeth 54 engage the tip 58 of the secondary vibrating elements 55, thereby transferring mechanical energy to the secondary vibrating elements 55. The secondary vibrating elements will then begin to vibrate, thereby generating charges on the mechanical to electrical energy conversion elements 57 that are then harvested by an appropriate electronics circuitry (not shown) and direct for use by certain load or for storage in appropriate electrical energy storage devices such as capacitors and/or rechargeable batteries. Thus, the rotating shaft 53 intermittently transfers its motion to the secondary vibratory elements 55 in that it engages the secondary vibratory elements 55 (or element) and at some later time, the rotating shaft 53 engages the secondary vibratory elements 55 again.

One major source of loss in the generator of the embodiment of FIG. 5 is the mechanical interface where the exciter (s) 54 contact the tip 58 of the secondary vibrating elements 55. One solution to eliminate these losses is the use of magnets in the excitation interface as described previously for the embodiments of FIGS. 3 and 4, noting that to increase the efficiency of transferring mechanical energy from the shaft 53 (i.e., the primary stage) to the secondary vibrating elements, the magnets are desired to be positioned as close to each other as possible as the exciter(s) 54 pass the magnets fixed to the tip 58 of the secondary vibrating element 55. The term "engage" as used herein includes both contacting interaction and magnetic interaction of the exciters 54 and the secondary vibratory elements 55.

It is appreciated by those familiar with the art that secondary vibrating elements of various types may be used instead of vibrating beams used in the above embodiments. For example, the secondary vibratory element may be mass-spring elements (similar to the mass-spring 10 shown in FIG. 1) that are attached to the housing 51 with the mass element facing the shaft 53, and are pushed away in the radial direction by the (preferably rounded) exciter teeth 54 as the shaft rotates. Alternatively, the secondary vibrating element may be configured to vibrate rotationally, in which mode it is similarly excited by the exciter teeth 54. Such and other similar alternative secondary vibrating elements are well known in the art. Furthermore, the shaft 53 or housing 51 carry the secondary vibratory elements 55 and may rotate with the other of the shaft 53 or housing 51 may be fixed and carry the exciters 54.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. An apparatus for generating electrical energy from a first motion having a low and/or variable frequency, the apparatus comprising:
   a first device to which the first motion is transferred; and
   a second device to which the first motion is intermittently transferred from the first device, the second device operating at a frequency which is higher and/or more constant that the first motion;
   wherein the first device comprises a vibrating mass and the vibrating mass is secured to a base by a spring element, the base being subjected to the first motion.

2. The apparatus of claim 1, wherein the mass includes one or more tips interacting with the second device to transfer the first motion thereto.

3. The apparatus of claim 2, wherein the second device comprises one or more vibrating members having one or more piezoelectric materials associated therewith such that the one or more tips interact with a portion of the one or more vibrating members to vibrate the one or more vibrating members to generate electrical energy from the one or more piezoelectric members associated therewith.

4. The apparatus of claim 3, wherein the one or more tips interact with the one or more vibrating members by contacting with the portion of the one or more vibrating members.

5. The apparatus of claim 3, wherein the one or more tips interact with the one or more vibrating members by creating a magnetic repulsion force with the portion of the one or more vibrating members.

6. The apparatus of claim 1, wherein the second device comprises three or more second devices and the three or more second devices are arranged radially around the first device.

7. An apparatus for generating electrical energy from a first motion having a low and/or variable frequency, the apparatus comprising:
   a first device to which the first motion is transferred; and
   a second device to which the first motion is intermittently transferred from the first device, the second device operating at a frequency which is higher and/or more constant that the first motion;
   wherein the first device comprises a rotating shaft;
   the shaft includes one or more tips interacting with the second device to transfer the first motion thereto, the second device comprises one or more vibrating members having one or more piezoelectric materials associated therewith such that the one or more tips interact with a portion of the one or more vibrating members to vibrate the one or more vibrating members to generate electrical energy from the one or more piezoelectric members associated therewith and the one or more tips interact with the one or more vibrating members by creating a magnetic repulsion force with the portion of the one or more vibrating members.

8. An apparatus for generating electrical energy from a first motion having a low and/or variable frequency, the apparatus comprising:
   a first device to which the first motion is transferred; and
   a second device to which the first motion is intermittently transferred from the first device, the second device operating at a frequency which is higher and/or more constant that the first motion;
   wherein the first device comprises a translating mass;
   the first mass includes a first portion interacting with the second device to transfer the first motion thereto, the second device comprises one or more vibrating members having one or more piezoelectric materials associated therewith such that the first portion interacts with a second portion of the one or more vibrating members to vibrate the one or more vibrating member to generate electrical energy from the one or more piezoelectric members associated therewith and the first portion interacts with the one or more vibrating members by creating a magnetic repulsion force with the second portion of the one or more vibrating members.

9. A method for generating electrical energy from a first motion having a low and/or variable frequency, the method comprising:
   transferring the first motion to a first device; and
   intermittently transferring the first motion from the first device to a second device operating at a frequency which is higher and/or more constant that the first motion;
   wherein the transferring comprises vibrating a mass at the low and/or variable frequency, the intermittently transferring comprises interacting a tip portion associated with the vibrating mass with one or more vibrating members having one or more piezoelectric materials associated therewith to vibrate the one or more vibrating members to generate electrical energy from the one or more piezoelectric members associated therewith, and the interacting comprising magnetically repulsing a portion of the one or more vibrating members.

10. A method for generating electrical energy from a first motion having a low and/or variable frequency, the method comprising:
    transferring the first motion to a first device; and
    intermittently transferring the first motion from the first device to a second device operating at a frequency which is higher and/or more constant that the first motion;
    wherein the transferring comprises rotating a shaft;
    the intermittently transferring comprises interacting a tip portion associated with the shaft with one or more vibrating members having one or more piezoelectric materials associated therewith to vibrate the one or more vibrating members to generate electrical energy from the one or more piezoelectric members associated therewith and the interacting comprising magnetically repulsing a portion of the one or more vibrating members.

11. A method for generating electrical energy from a first motion having a low and/or variable frequency, the method comprising:
    transferring the first motion to a first device; and
    intermittently transferring the first motion from the first device to a second device operating at a frequency which is higher and/or more constant that the first motion;
    wherein the transferring comprises translating a mass;
    the intermittently transferring comprises interacting a first portion of the translating mass with one or more vibrating members having one or more piezoelectric materials associated therewith to vibrate the one or more vibrating members to generate electrical energy from the one or more piezoelectric members associated therewith and the interacting comprises magnetically repulsing the second portion of the one or more vibrating members.

* * * * *